United States Patent [19]

Johnson

[11] 3,860,424

[45] Jan. 14, 1975

[54] LED DISPLAY

[75] Inventor: Bertrand Harold Johnson, Murray Hill, N.J.

[73] Assignee: Bell Telephone Laboratories, Incorporated, Murray Hill, N.J.

[22] Filed: Oct. 18, 1973

[21] Appl. No.: 407,529

Related U.S. Application Data

[63] Continuation-in-part of Ser. No. 214,134, Dec. 30, 1971, abandoned.

[52] U.S. Cl. ........................ 96/38.4, 117/8, 117/38, 29/25.13

[51] Int. Cl. ........................ G03c 5/00

[58] Field of Search ............ 96/35, 35.1, 38.3, 36.2, 96/38.4, 27 R; 29/25.1, 25.11, 25.13, 578, 589, 569 L, 572; 313/108 D, 109.5; 317/235 N; 117/5.5, 8, 37, 38, 159

[56] References Cited

UNITED STATES PATENTS

| | | | |
|---|---|---|---|
| 3,397,334 | 8/1968 | Motson | 313/108 |
| 3,672,925 | 6/1972 | Feldstein | 96/38.4 |
| 3,758,304 | 9/1973 | Janssen et al. | 96/38.4 |

*Primary Examiner*—Norman G. Torchin
*Assistant Examiner*—Edward C. Kimlin
*Attorney, Agent, or Firm*—P. V. D. Wilde

[57] ABSTRACT

LED displays with integrated logic are typically formed by bonding the LED devices and often the logic chips to large alumina or other ceramic substrates, lead frame substrates or other substrates. Typically the arrangement has a large area of uncovered substrate due to the large display area compared with the smaller chip size. Reflection of bright light from the substrate detracts from the contrast of the display. It has been found that photoresist materials conventionally in use turn black when heated to temperatures in excess of those recommended for post-baking (e.g., > 200° C). It is convenient to cover the inactive portion of the substrate with a patterned layer of photoresist (leaving windows for chip and circuit bonding) and then, through a heat treatment, which may already exist in the IC process, to blacken the photoresist layer. The photoresist layer forms a part of the finished device. Adhesion of the photoresist is surprisingly tenacious.

10 Claims, 8 Drawing Figures

LED DISPLAY

CROSS REFERENCE TO RELATED APPLICATION

This application is a Continuation-in-part of copending application; Ser. No. 214,134 filed Dec. 30, 1971, now abandoned.

The visibility of electroluminescent displays often is highly dependent on the contrast between the light emitting areas and the surrounding substrate. This invention is directed to electroluminescent displays with improved visibility due to enhanced contrast.

Visibility is a subjective term generally used to indicate the degree of obviousness with which the human eye perceives an image, in this case, an electroluminescent display. Contrast ratio is the ratio of the luminance (brightness) of a display element to that of the surrounding background.

Electroluminescent display visibility is a direct function of the contrast ratio as the ambient illumination is increased, and becomes strongly contrast dependent at high ambient light levels. Therefore, the background reflectivity surrounding the display element should be minimized so that reflected light does not compete successfully with the light emitting display element. Moreover, when the display element is not emitting light, the background should appear similar to the light emitting regions both in hue and reflectivity in order that those portions of the light emitting region that are "off" appear invisible.

A numeric or alpha-numeric display containing light emitting diodes (LEDs) with or without silicon logic chips can be fabricated on a ceramic or insulating substrate, or a lead frame substrate, or any other appropriate supporting material, using conventional thin or thick film technology. In ceramic hybrid type structures the substrate which supports both the active components and the metallization used for interconnecting the light emitting diodes with the logic circuit on the silicon chip is typically a ceramic such as high density aluminum oxide. These materials are normally white or very light in color, so that although they meet the usual substrate criteria, the high optical reflectivity of the ceramic results in a low contrast ratio and less than optimum display visibility. Also the metallization itself is typically highly reflective, thereby reducing the display contrast, often to an extent comparable with that of the ceramic.

More recent LED numeric devices have lead frames supporting several electroluminescent chips wherein an entire numeric is formed in each chip and the whole package is encapsulated in transparent epoxy or other plastic. With improvements in material quality and uniformity several characters can be incorporated in a single large chip. In these devices the substrate material is typically metal such as steel electroplated with copper and gold, or other appropriate conductive material or combination of materials. Again, these substrates are typically highly reflecting, and interfere with the visibility of the display.

Various techniques are being used to improve visibility. A common technique is to provide an optical transmission filter selected to transmit only the light wavelength emitted from the display element. However, the realizable improvement in contrast is limited by the effective bandpass of the filter. If the filter transmission loss is increased to suppress ambient reflections from the regions surrounding the active light-emitting semiconductor, the brightness of the display suffers proportionately to the reduction in reflection. This problem is especially acute with green emitting devices.

Another approach suggested for ceramic substrates is to blacken the ceramic. This technique effectively reduces substrate reflectivity but is ineffective against reflections from the metallization applied later. In addition, the blackening process leaves the substrate surface rough and incompatible with high quality thin film processing.

This invention is a method for improving LED display visibility using conventional thin film processing and overcomes at least in part the shortcomings described above. The method utilizes a light absorbing photoresist film which covers the exposed substrate and in appropriate cases the metallization normally seen by the observer. The film is compatible with all bonding and encapsulation processes conventionally used and does not interfere with the display-observer optical link.

Conveniently, the film is a reapplication of the photoresist used to define the metallization pattern, except that the mask is made such as to reveal only the bonding areas for the LEDs, the silicon chips and the interconnecting pads. With the photoresist layer in place, the substrate is heated beyond the recommended photoresist curing limit. The result is that the photoresist changes from its usual light brown color to a deep, light-absorbing brown or black color. At the same time, it becomes tenaciously adherent to the substrate. This darkened photoresist layer remains in the finished device covering the regions surrounding the light-emitting regions thus enhancing the contrast of the display.

The step of heating the photoresist to darken its color can occur at any stage in the processing. However, the process described here includes the step of bonding the LEDs and the silicon chip to the substrate. This step includes a heating operation that is adequate to achieve darkening of the photoresist. Therefore, no additional heating step is required.

These and other aspects of the invention are treated more fully in the following detailed description. In the drawing.

Figure 1:
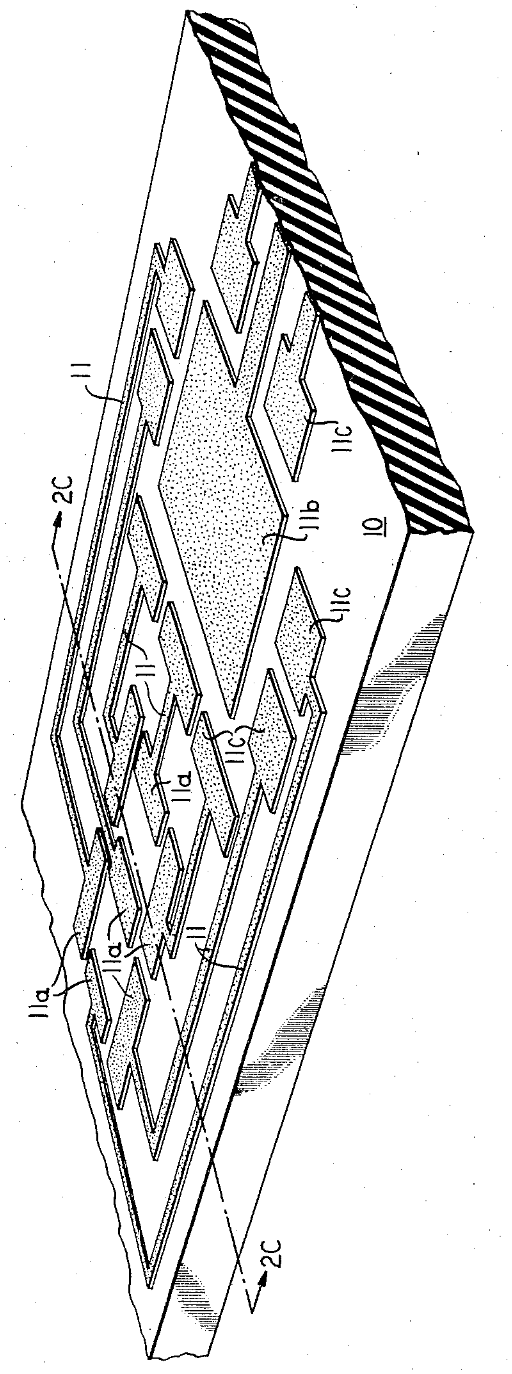
FIG. 1 is a perspective view of a metallized ceramic substrate prior to bonding the LEDs and integrated circuit components to make a finished display device.

The problem of poor light contrast from conventional metallized ceramic substrates is evident from FIG. 1. The entire assembly at this stage in the fabrication sequence is highly reflecting. Shown in the Figure is a ceramic substrate 10, typically high density alumina, beryllia or similar stable refractory oxide or mixtures of oxides, carbides or other appropriate materials, and formed usually by compressed powder or glass forming techniques.

It may also be advantageous to use, as a substrate material, semiconductors such as silicon or even the light-emitting semiconductor itself. Arrangements in which the light-emitting characteristics of a bulk gallium phosphide device, e.g., a monolithic-IC, are enhanced according to the invention can readily be envisioned.

The ceramic is covered selectively with a metallized pattern 11. The portions designated 11*a* are the seven bars to which the LEDs will be bonded; area 11*b* is the bonding area for the integrated circuit chip that provides the logic for the seven bar array, and areas denoted 11*c* are the bonding pads for interconnection. The metallization is typically gold but may be silicon, tungsten, molybdenum, aluminum or other suitable conductor. Except for the regions 11*a*, which will be occupied by the LEDs and the region 11*b* that accommodates the IC chip, the remaining area, and the entire area immediately surrounding the light-emitting regions, is highly reflecting.

Figure 2A:
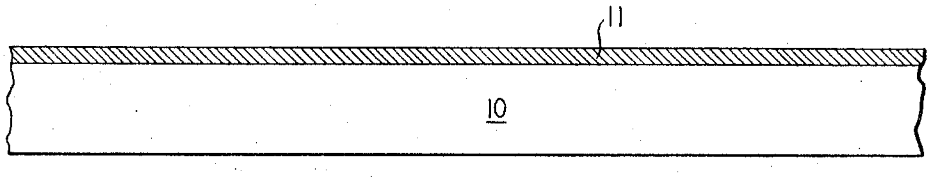
FIGS. 2A to 2F are sectional views illustrating the processing of the ceramic substrate according to one aspect of the invention.
Figure 2B:
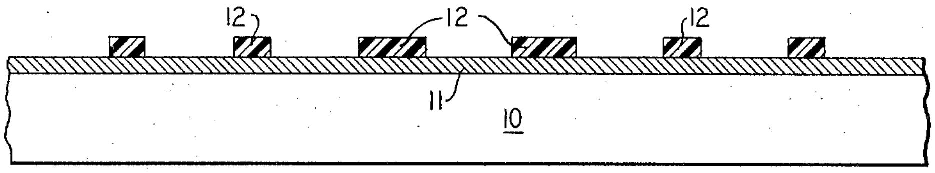
Figure 2C:
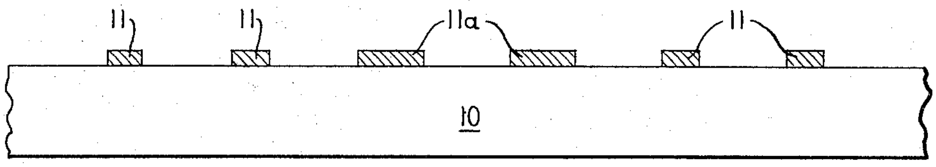

An exemplary processing sequence used to produce the substrate as it appears in FIG. 1 is schematically represented by FIGS. 2A to 2C. FIG. 2C is a section of FIG. 1 at the plane indicated by line 2C—2C. Referring first to FIG. 2A, the ceramic substrate 10 is shown coated with a uniform metal layer 11. The metal layer is masked with a standard PR mask 12, shown in FIG. 2B, and etched to produce in FIG. 2C, the metallized ceramic circuit board appearing in FIG. 1.

Figure 2D:
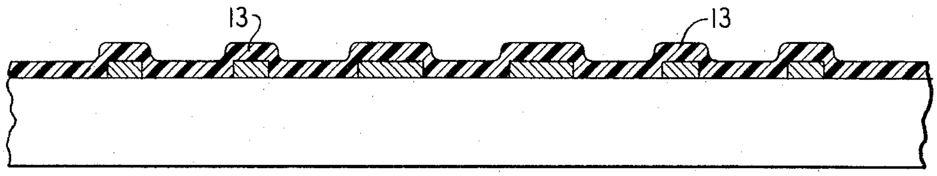
Figure 2E:
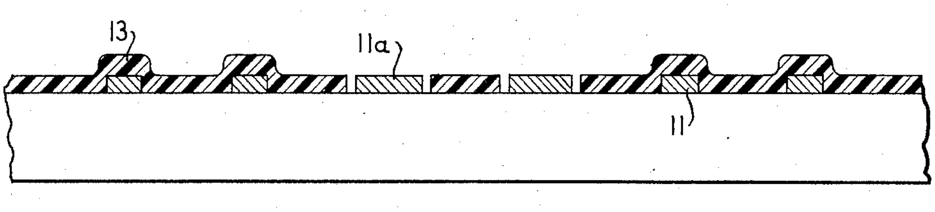

The added step, according to the invention, of covering the reflecting areas of the display support with a high contrast, light-absorbing coating is indicated by FIGS. 2D and 2E. This step will be treated in detail because it is the point of departure from the standard process even though the photoresist technology on which it is based is also well known.

After all the photolithographic and etching steps have been completed according to standard routine and the resultant circuitry tested, the following exemplary process is applied to the entire ceramic substrate.

EXAMPLE I

1. Immerse entire substrate in boiling trichlorethylene for 5 minutes.
2. Rinse substrate in deionized (D-I) water and ultrasonically agitate for 1 minute.
3. While still wet from D-I rinse, immerse substrate in passivation solution of 1 part ammonium persulfate to 10 parts D-I water for 5 minutes at 23°C. This treatment improves the adhesion of the metallization.
4. Rinse in D-I water (3 complete flushings) for 3 minutes in ultrasonic agitation.
5. Bake at 120°C for 30 minutes in nitrogen gas.
6. Blow clean with filtered nitrogen gas.
7. Immediately apply photoresist film or place substrate in desiccator as adhesion of photoresist film is degraded if substrate is damp when film is applied. The photoresist used in this example was an organic solvent solution of cresol-formaldehyde resins with photodecomposable naphthoquinone diazides. The formaldehyde resin, 77 percent by weight, is:

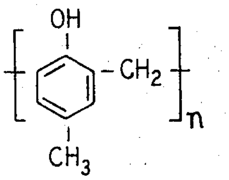

The napthoquinone diazide, 23 percent by weight, is

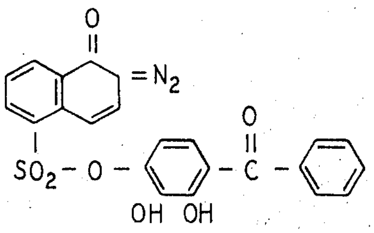

The solvents are 81 percent ethyl glycol acetate, 10 percent xylene, and 9 percent n-butyl acetate. This is a positive photoresist that becomes soluble in aqueous alkaline developers after exposure to ultraviolet light. The change in solubility is a result of the photochemical decomposition of the diazide followed by rearrangement and hydrolysis:

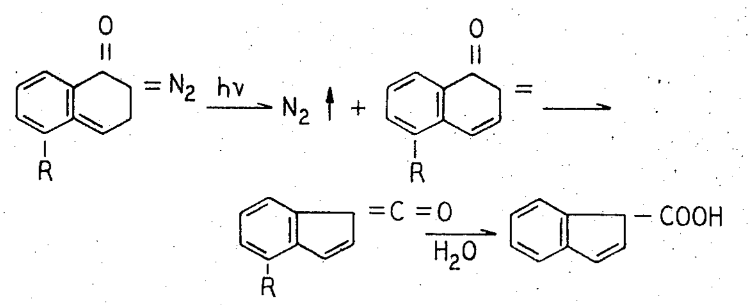

8. If substrate has been placed in desiccator for short term storage, again blow clean with $N_2$ before film is applied.
9. All photoresist must be filtered before use with a 0.8$\mu$ membrane type filter.
10. The photoresist is applied to the substrate which is mounted on a turntable. The substrate is then spun at 600 rpm for 30 seconds in an enclosed vacuum hood.
11. The substrate with the uniform film approximately 8$\mu$ thick is then baked in nitrogen ambient at 70°C for 20 minutes. The substrate then appears as in FIG. 2D with the photoresist layer shown at 13.
12. After visual inspection for cracks and poor adhesion, the film is exposed with ultraviolet light through a photomask for 4 minutes. The photomask is patterned to expose the areas where the photoresist is not wanted, i.e., the bonding regions 11*a*, 11*b* and 11*c* in the Figures. It may also be advantageous to leave exposed those regions between the bar segments to deemphasize the delineation between the segments.
13. The exposed film is removed by aqueous alkaline developer and D-I water solution (1:1) by spraying and soaking for 2 minutes.
14. The substrate is then rinsed in ≈ 60°C D-I water.
15. The substrate is dried in nitrogen gas and inspected for proper film removal.
16. The substrate is then thermally cycled in an air ambient to 350°C starting at 150°C with a slope of 50°C/5 minutes throughout the entire thermal cycle.

The resulting substrate is shown in FIG. 2E.

As a result of the thermal treatment, the photoresist layer assumes a deep brown color, thus giving a high degree of contrast to the finished display.

Figure 2F:
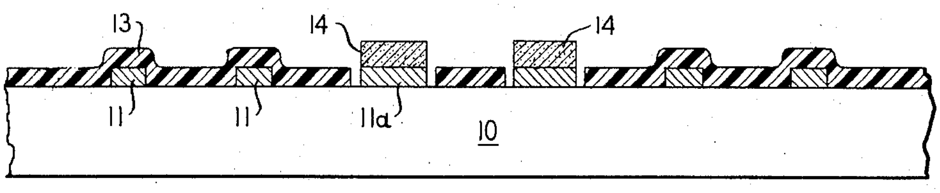

The remaining processing consists of bonding the LEDs and the integrated circuit chips to the bonding pads left exposed by the darkened photoresist layer. The final assembly is shown in FIG. 2F with the LEDs denoted 14. The LEDs may be GaP, GaAsP or any other electroluminescent device.

The thermal treatment described in the foregoing is exemplary only. It is convenient because it is the temperature used for bonding the final elements of the assembly. Thus, in this process, the darkening of the photoresist occurs without an added step. The darkening of the photoresist has been found to occur at temperatures in excess of 200°C. The baking time to achieve optimum color will be somewhat longer at this temperature. These temperatures are well in excess of the temperatures recommended for post-baking of photoresist films. The excellent adhesion of the photoresist that occurs with the change in color is not consistent with ordinary photoresist objectives, but is a significant benefit for the application to which the invention is directed. The darkened coating has been found to be scratch resistant and aids in protecting the display device through subsequent handling.

The thickenss of the photoresist layer does not appear to be critical. Very thin photoresist films will take on an acceptably dark color when heated sufficiently. Very thick films require longer, or more severe heating and are inclined to be less adherent (even though they may appear sufficiently dark) if the heat treatment is not adequate. Film thicknesses are typically in the range of 0.1 to 10 microns. Films can be applied by spinning, spraying, dipping, roll casting or any other appropriate method.

Coatings of a variety of photoresist materials were applied to ceramic substrates to demonstrate the uniform behavior of photoresist materials when used for the purpose of the invention.

EXAMPLE II

A high density alumina substrate was coated with photoresist by the technique described in EXAMPLE I. The photoresist in this case was a xylene solution of the cyclized poly(isoprene):

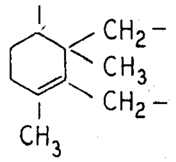

having a number-average molecular weight of 65,000. The photosensitive component is 2,6-bis(p-azidobenzal)-4-methylcyclohexanone

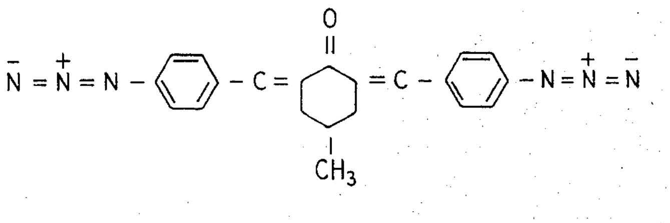

Photolysis of this azide results in the evolution of nitrogen and the formation of an active nitrene intermediate:

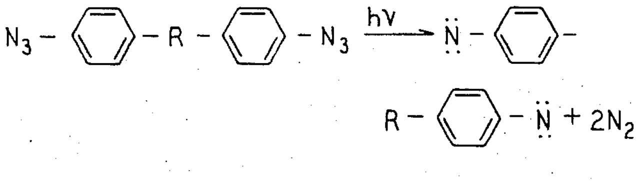

This nitrene is capable of coupling with the neighboring poly(isoprene) either by hydrogen abstraction with addition or by an insertion reaction into either saturated or unsaturated carbon-carbon bonds. The net result is a cross-linked polymer of reduced solubility. The resist therefore is classified as a negative resist. This resist is photo-sensitive to wavelengths between about 3,500–4,500 Angstroms and can be exposed with a standard mercury arc lamp. An appropriate developer is a low boiling petroleum distillate, Stoddard Solvent, and the rinse may be methanol. The high temperature baking operation was the same used in the former example. The resulting darkened film was qualitatively equivalent to that obtained previously.

EXAMPLE III

EXAMPLE II was repeated using another photoresist material, a xylene solution of poly(isobutylene) mixed with bifunctional aromatic azide compounds containing an azidobenzene group as:

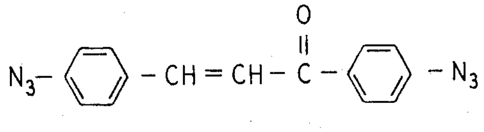

This bifunctional agent links two of the poly(isobutylene) molecules by means of coupling reactions. This photoresist can be exposed with a mercury arc lamp and developed with Stoddard Solvent. A heat treatment at a temperature in excess of 200°C will darken the film and increase film adhesion in essentially the same fashion previously described.

Two other positive photoresists, consisting of solutions of cresol-formaldehyde resins with a photodecomposable napthoquinone diazide, were tested with the same qualitative results. While the mechanism responsible for the darkening of the photoresist film and the enhanced adhesion is not understood, the results are remarkably consistent. The several photoresist materials tested represent a cross section of the prominent photoresist materials known in the art.

Figure 3:
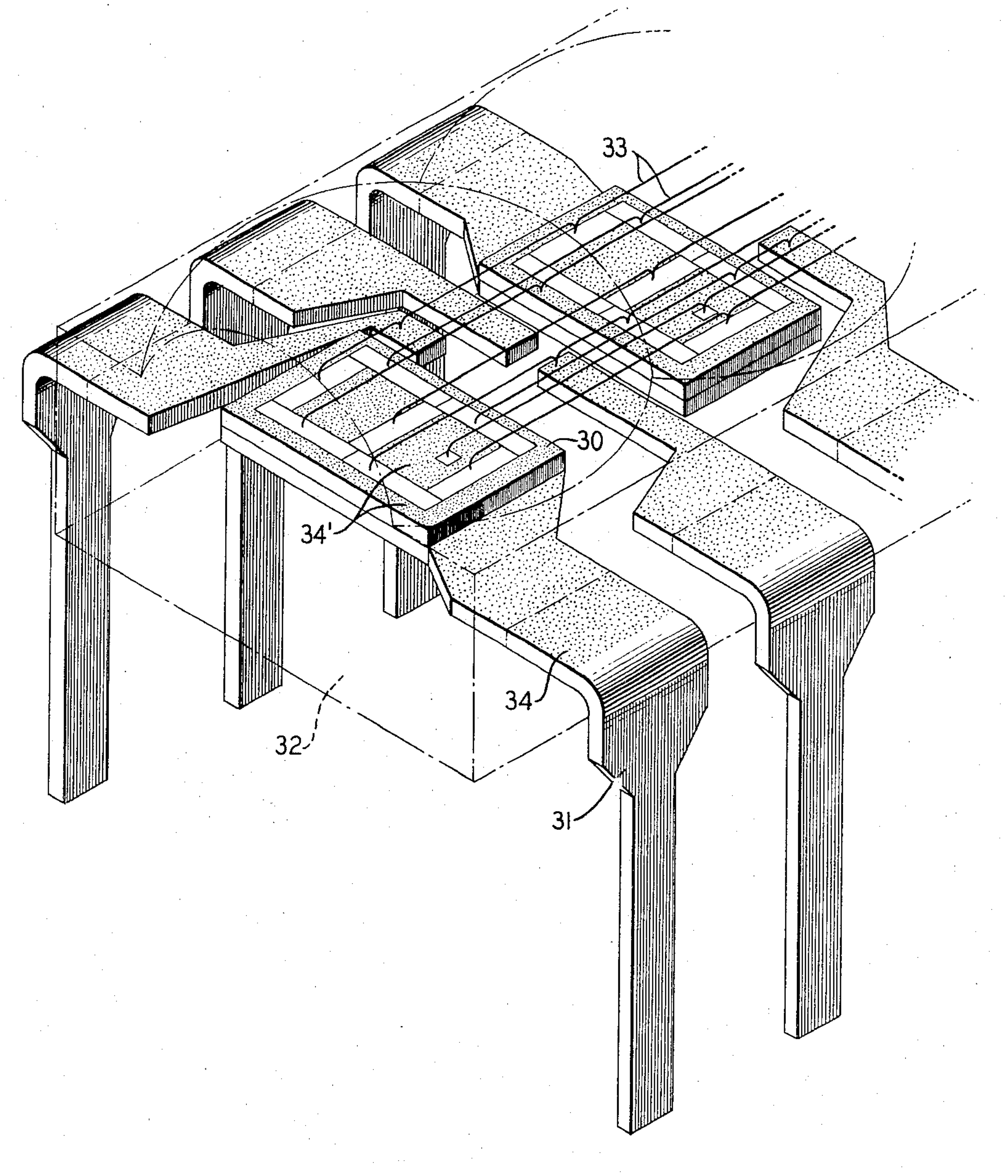
FIG. 3 is a perspective view of a portion of a photoresist coated lead frame device.

The application of the darkened resist layer to a lead frame device is depicted in FIG. 3. This Figure shows in perspective a portion of a display device including an electroluminescent numeric 30 supported on a gold plated lead frame 31 and encapsulated in epoxy 32. The epoxy encapsulant serves also to magnify optically the numeric 30. Electrical contact to the base of the chip is via the lead frame. The contacts to the bars on the numeric are made with wire bonds 33. The darkened photoresist coating is represented by the stippled areas 34. It covers the unused regions of the display. The coating may optionally cover regions 34' on the monolithic chip itself. In this event the photoresist coating 34' can be the same mask as was used for diffusing the numeric configuration into the chip.

In lead frame structures it is not unusual to use an inexpensive base metal and overcoat the portions of the lead frame that serve as bonding sites. For example, the lead frame may advantageously be steel or other ferrous alloy, plated first with copper and then with gold. Selective electroplating, displacement plating or electroless plating can be applied using a photomask. In this event the photomask can serve conveniently as the coating 34.

Various additional modifications and deviations of the invention will occur to those skilled in the art. All such variations that basically rely on the teachings through which this invention has advanced the art are properly considered to be within the spirit and scope of this invention.

What is claimed is:

1. A method for enhancing the contrast of an electroluminescent display device in which light-emitting devices are affixed to portions of a substrate and in which other portions of the substrate not covered with light-emitting devices are reflective and tend to reduce the contrast of the light-emitting regions with respect to the background of the display, the method characterized by photolithographically applying selectively to the light-reflecting portions a photoresist, and baking the photoresist at a temperature sufficient to darken the photoresist significantly and cause it to adhere permanently to those portions so as to remain a part of the finished device.

2. The method of claim 1 in which the reflecting portions over which the photoresist is applied include portions of a highly reflecting ceramic substrate.

3. The method of claim 1 in which the reflecting portions over which the photoresist is applied include conductor patterns of highly reflecting metallization.

4. The method of claim 1 in which the photoresist is baked at a temperature exceeding 200°C.

5. The method of claim 1 in which the photoresist is baked at a temperature exceeding 300°C.

6. The method of claim 1 in which the light-emitting devices are gallium compound semiconductor diodes.

7. The method of claim 1 in which the photoresist is applied with a thickness in the range of 0.1 to 10 microns.

8. The method of claim 1 in which at least parts of the light-emitting devices are affixed to the substrate by a bonding technique that uses a heat treatment step, and the photoresist is darkened as a result of this heat treatment step.

9. The method of claim 1 in which the substrate is a metal lead frame.

10. The method of claim 1 in which the photoresist is applied also to portions of the light-emitting devices.

* * * * *